(12) United States Patent
Sang et al.

(10) Patent No.: US 11,562,988 B2
(45) Date of Patent: Jan. 24, 2023

(54) AREA LIGHT SOURCE, METHOD FOR MANUFACTURING THE SAME AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Jian Sang, Beijing (CN); Haiwei Sun, Beijing (CN); Junjie Ma, Beijing (CN)

(73) Assignees: BEIJING BOE OPTOELECTRONICS TECHNOLOGY GROUP CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 507 days.

(21) Appl. No.: 16/478,340

(22) PCT Filed: Dec. 13, 2018

(86) PCT No.: PCT/CN2018/120814
§ 371 (c)(1),
(2) Date: Jul. 16, 2019

(87) PCT Pub. No.: WO2019/184456
PCT Pub. Date: Oct. 3, 2019

(65) Prior Publication Data
US 2021/0335759 A1    Oct. 28, 2021

(30) Foreign Application Priority Data

Mar. 29, 2018    (CN) .......................... 201810272082.3

(51) Int. Cl.
*H01L 25/075*    (2006.01)
*H01L 23/00*    (2006.01)
(Continued)

(52) U.S. Cl.
CPC .......... *H01L 25/0753* (2013.01); *H01L 24/32* (2013.01); *H01L 24/33* (2013.01);
(Continued)

(58) Field of Classification Search
CPC ....... H01L 25/0753; H01L 2224/33181; H01L 24/33; H01L 24/32; H01L 2933/0066;
(Continued)

(56) References Cited

U.S. PATENT DOCUMENTS

2009/0279285 A1    11/2009    Nakayama et al.
2011/0051043 A1*    3/2011    Kim .................... H01L 25/0753
                                                               349/64
(Continued)

FOREIGN PATENT DOCUMENTS

CN    105206728 A    12/2015
CN    105303985 A    2/2016
(Continued)

OTHER PUBLICATIONS

Extended European Search Report for Application No. 18899017.0-1211, dated Dec. 9, 2021, 7 Pages.

*Primary Examiner* — Marcos D. Pizarro
*Assistant Examiner* — Antonio B Crite
(74) *Attorney, Agent, or Firm* — Brooks Kushman P.C.

(57) ABSTRACT

An area light source, a method for manufacturing the same and a display device are provided. The area light source includes: a first conductive structure and a second conductive structure arranged opposite to each other; and a light-emitting layer arranged between the first conductive structure and the second conductive structure and including a plurality of light-emitting chips insulated from each other. A first electrode of each light-emitting chip is electrically connected to the first conductive structure, and a second (Continued)

electrode of each light-emitting chip is electrically connected to the second conductive structure.

16 Claims, 5 Drawing Sheets (51) Int. Cl.
    *H01L 33/50*     (2010.01)
    *H01L 33/60*     (2010.01)
    *H01L 33/62*     (2010.01)
    *G02F 1/1335*     (2006.01)
    *G02F 1/13357*     (2006.01)
    *G02F 1/1333*     (2006.01)

(52) U.S. Cl.
    CPC .............. *H01L 33/50* (2013.01); *H01L 33/60* (2013.01); *H01L 33/62* (2013.01); *H01L 2224/32225* (2013.01); *H01L 2224/33181* (2013.01); *H01L 2933/0041* (2013.01); *H01L 2933/0066* (2013.01)

(58) Field of Classification Search
    CPC ....... H01L 33/62; H01L 33/50; H01L 33/502; H01L 33/504; H01L 2933/0041; G02F 1/133612

See application file for complete search history.

(56) References Cited

U.S. PATENT DOCUMENTS

| | | | |
|---|---|---|---|
| 2011/0195532 A1* | 8/2011 | Lerman | H01L 25/0753 257/E33.061 |
| 2014/0209945 A1 | 7/2014 | Baldridge et al. | |
| 2015/0049465 A1 | 2/2015 | Park et al. | |
| 2017/0250220 A1 | 8/2017 | Wang | |
| 2017/0256679 A1* | 9/2017 | Fan | G09G 5/02 |
| 2018/0081241 A1 | 3/2018 | Fan | |
| 2018/0114481 A1 | 4/2018 | Fu et al. | |
| 2018/0233493 A1* | 8/2018 | Kawai | H01L 33/36 |

FOREIGN PATENT DOCUMENTS

| | | |
|---|---|---|
| CN | 105607346 A | 5/2016 |
| CN | 106501998 A | 3/2017 |

* cited by examiner

Fig. 10

AREA LIGHT SOURCE, METHOD FOR MANUFACTURING THE SAME AND DISPLAY DEVICE

CROSS-REFERENCE TO RELATED APPLICATIONS

This application is the U.S. national phase of PCT Application No. PCT/CN2018/120814 filed on Dec. 13, 2018, which claims priority to Chinese Patent Application No. 201810272082.3 filed on Mar. 29, 2018, which are incorporated herein by reference in their entireties.

TECHNICAL FIELD

The present disclosure relates to the field of display technology, in particular to an area light source, a method for manufacturing the same, and a display device.

BACKGROUND

In a conventional display device, point light sources each acquired by encapsulating Light-Emitting Diodes (LEDs) to form a light bar, so as to provide a line light source. Next, a direct-type or edge-type structure is adopted, so as to convert the line light source into an area light source through a light guide plate and any other optical membranes. In this mode, a desired backlight source has a relatively complex structure. In addition, when the LED light bars are arranged in a concentrated manner, a relatively high current is generated, so excessive heat is generated locally, and such a phenomenon as wrinkled membrane easily occurs. Furthermore, the power consumption is relatively large due to large light utilization. Even if the edge-type area light source is adopted, it is still impossible to control a brightness value at a certain region.

SUMMARY

In one aspect, the present disclosure provides in some embodiments an area light source, including: a first conductive structure and a second conductive structure arranged opposite to each other; and a light-emitting layer arranged between the first conductive structure and the second conductive structure and including a plurality of light-emitting chips insulated from each other. A first electrode of each light-emitting chip is electrically connected to the first conductive structure, and a second electrode of each light-emitting chip is electrically connected to the second conductive structure.

In a possible embodiment of the present disclosure, the light-emitting chips are separated from each other in a direction parallel to the first conductive structure and the second conductive structure, and the light-emitting layer further includes an insulation material arranged between adjacent light-emitting chips.

In a possible embodiment of the present disclosure, the insulation material is configured to emit light under the excitation of a light beam from each light-emitting chip.

In a possible embodiment of the present disclosure, each light-emitting chip is configured to emit a blue light beam, and the insulation material includes a quantum-dot material or a fluorescent adhesive.

In a possible embodiment of the present disclosure, the area light source further includes a first protection structure and a second protection structure arranged opposite to each other. The first conductive structure is arranged at a side surface of the first protection structure facing the second protection structure, and the second conductive structure is arranged at a side surface of the second protection structure facing the first protection structure.

In a possible embodiment of the present disclosure, the area light source further includes a reflection layer arranged at a side of the light-emitting layer away from the second conductive structure.

In a possible embodiment of the present disclosure, the reflection layer is arranged between the first protection structure and the first conductive structure.

In a possible embodiment of the present disclosure, the first protection structure and the second protection structure are each a rigid substrate, a circuit board or a flexible substrate.

In a possible embodiment of the present disclosure, at least one of the first conductive structure and the second conductive structure includes a plurality of conductive lines, and each conductive line is connected to a corresponding electrode of at least one light-emitting chip.

In a possible embodiment of the present disclosure, the light-emitting chips are arranged in an array form, the first conductive structure is of a surface-like shape, and the second conductive structure includes a plurality of conductive lines and is configured to control the light-emitting chips at different regions.

In a possible embodiment of the present disclosure, the light-emitting chips are arranged in an array form, the second conductive structure is of a surface-like shape, and the first conductive structure includes a plurality of conductive lines and is configured to control the light-emitting chips at different regions.

In a possible embodiment of the present disclosure, the first electrode of each light-emitting chip is connected to the first conductive structure via an anisotropic conductive adhesive, and the second electrode of each light-emitting chip is connected to the second conductive structure via an anisotropic conductive adhesive.

In another aspect, the present disclosure provides in some embodiments a display device including the above-mentioned area light source as a backlight source.

In yet another aspect, the present disclosure provides in some embodiments a method for manufacturing an area light source, including: forming a first conductive structure; forming a plurality of light-emitting chips spaced apart from each other and arranged on the first conductive structure, adjacent light-emitting chips of the plurality of light-emitting chips being insulated from each other, each light-emitting chip comprising a first electrode and a second electrode, the first electrode being electrically connected to the first conductive structure; and forming a second conductive structure connected to the second electrode of each light-emitting chip.

In a possible embodiment of the present disclosure, subsequent to forming the plurality of light-emitting chips spaced apart from each other and arranged on the first conductive structure, the method further includes forming an insulation material filled between adjacent light-emitting chips.

In a possible embodiment of the present disclosure, the method further includes forming a first protection structure, and forming a second protection structure covering the second conductive structure. The forming the first conductive structure includes forming the first conductive structure on the first protection structure.

In a possible embodiment of the present disclosure, prior to forming the first conductive structure on the first protection structure, the method further includes forming a reflection layer on the first protection structure.

In a possible embodiment of the present disclosure, the forming the first conductive structure includes forming the first conductive structure of a surface-like shape. The forming the second conductive structure includes forming a conductive material layer and patterning the conductive material layer to form a plurality of second conductive lines each connected to the second electrode of at least one light-emitting chip.

In a possible embodiment of the present disclosure, the forming the second conductive structure includes forming the second conductive structure of a surface-like shape. The forming the first conductive structure includes forming a conductive material layer and patterning the conductive material layer to form a plurality of first conductive lines each connected to the first electrode of at least one light-emitting chip.

DETAILED DESCRIPTION

In order to make the objects, the technical solutions and the advantages of the present disclosure more apparent, the present disclosure will be described hereinafter in a clear and complete manner in conjunction with the drawings and embodiments.

An object of the present disclosure is to provide an area light source and a display device, so as to provide the area light source with excellent performance, and control a brightness value at a certain region.

Figure 1:
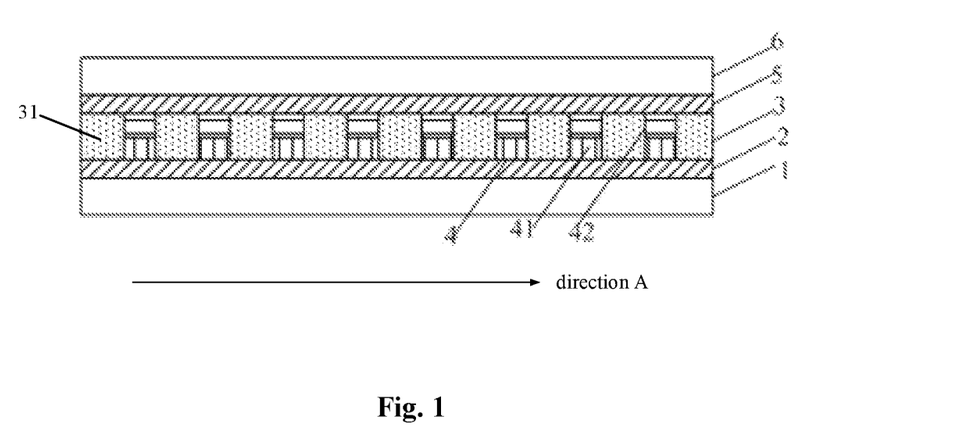
FIGS. 1-2 are sectional views of an area light source according to one embodiment of the present disclosure.

The present disclosure provides in some embodiments an area light source which, as shown in FIG. 1, includes: a first conductive structure 2 and a second conductive structure 5 arranged opposite to each other; and a light-emitting layer 3 arranged between the first conductive structure 2 and the second conductive structure 5 and including a plurality of light-emitting chips 4 insulated from each other. A first electrode 41 of each light-emitting chip 4 is electrically connected to the first conductive structure 2, and a second electrode 42 of each light-emitting chip 4 is electrically connected to the second conductive structure 5.

The first electrode 41 may be a negative electrode and the second electrode 42 may be a positive electrode, or the first electrode 41 may be a positive electrode and the second electrode 42 may be a negative electrode. Each light-emitting chip 4 may be a vertical chip, i.e., one electrode of the light-emitting chip may face upward, and the other electrode may face downward.

According to the embodiments of the present disclosure, the area light source with a lamination structure may include the first conductive structure 2 and the second conductive structure 5 arranged opposite to each other, and the light-emitting layer 3 arranged between the first conductive structure 2 and the second conductive structure 5 and including the light-emitting chip 4. The light-emitting chip 4 may be powered on through the first conductive structure 2 and the second conductive structure 5, so as to emit light.

In the embodiments of the present disclosure, the area light source may be provided when the light-emitting chip 4 is encapsulated, so it is able to reduce the difficulty in converting the point light source to the line light source and then to the area light source, remarkably increase the light utilization and reduce the power consumption. In addition, it is unnecessary to provide any other element, so it is able to provide an ultra-thin product and reduce the manufacture cost. Furthermore, when each light-emitting chip 4 is capable of emitting a monochromatic light beam, e.g., a red light beam, a green light beam or a blue light beam, the light-emitting chips emitting the red light beam, the green light beam and the blue light beam may be arranged periodically, so as to enable the area light source to achieve a color display function.

In some embodiments of the present disclosure, as shown in FIG. 1, the light-emitting chips 4 may be spaced apart from each other in a direction A parallel to the first conductive structure 2 and the second conductive structure 5. the light-emitting layer 3 may further include an insulation material 31 arranged between adjacent light-emitting chips 4. The insulation material 31 may be filled between the adjacent light-emitting chips 4, so as to enable the light-emitting chips 4 to be insulated from each other. The insulation material 31 may be an organic resin material or an inorganic insulation material, e.g., silicon oxide or silicon nitride.

In some embodiments of the present disclosure, the insulation material 31 is capable of emitting light under the excitation of a light beam from each light-emitting chip 4. In this regard, during the operation of the area light source, both the light-emitting chip 4 and the insulation material 31 may emit light, so as to increase the brightness of the area light source.

During the implementation, each light-emitting chip 4 may emit a blue light beam, and the insulation material 31 may be a quantum-dot material or a fluorescent adhesive capable of emitting light under the excitation of the blue light beam from the light-emitting chip 4. Through the combination of the light-emitting chip 4 and the insulation material 31, it is able to emit a white light beam. Of course, a component of the insulation material 31 and a color of the light beam from each light-emitting chip 4 may be adjusted so as to enable the light-emitting layer 3 to generate the light beam in any other color. In addition, the light-emitting chips 4 capable of emitting the light beams in different colors and different insulation materials 31 may be combined so as to generate the light beams in different colors, thereby to provide a colorful light source.

In some embodiments of the present disclosure, the area light source may further include a first protection structure 1 and a second protection structure 6 arranged opposite to each other. The first conductive structure 2 may be arranged at a side surface of the first protection structure 1 facing the second protection structure 6, and the second conductive structure 5 may be arranged at a side surface of the second protection structure 6 facing the first protection structure 1.

The first protection structure 1 and the second protection structure 6 may each be a rigid substrate, a circuit board, or a flexible substrate, e.g., a substrate made of polyethylene terephthalate (PET) or polyimide (PI). The first protection structure 1 and the second protection structure 6 may be adopted to protect the area light source, so as to prevent oxygen and moisture from entering the area light source and prevent the area light source from being scratched. When the first protection structure 1 and the second protection structure 6 are each a flexible substrate, the area light source may also be applied to a flexible display device.

It should be appreciated that, the protection structure at a light-exiting side needs to be made of a transparent material, e.g., a thin transparent PET layer, so as to allow the light to pass therethrough, prevent oxygen and moisture from entering the area light source, and prevent the area light source from being scratched.

Figure 2:
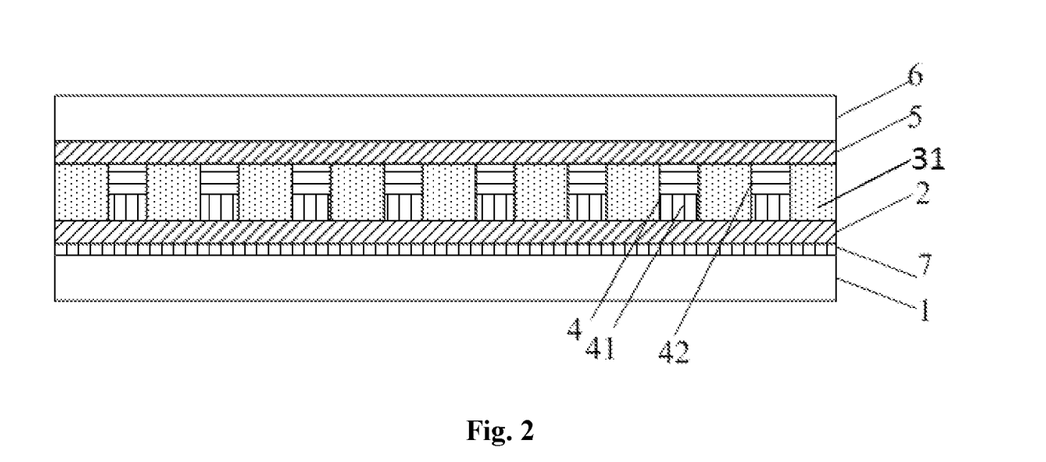

In some embodiments of the present disclosure, as shown in FIG. 2, the area light source may further include a reflection layer 7 arranged at a side of the light-emitting layer 3 away from the second conductive structure 5. The reflection layer 7 may reflect the light beams from the light-emitting layer 3, so that light beams from the area light source are emitted to a same side.

The reflection layer 7 may be arranged at a surface of the first protection structure 1 facing the first conductive structure 2, or at a surface of the first protection structure 1 away from the first conductive structure 2. Due to the protection function of the first protection structure 1, it is preferred that the reflection layer 7 may be arranged between the first protection structure 1 and the first conductive structure 2. In this regard, the first protection structure 1 may also protect the reflection layer 7. The reflection layer 7 and the first protection layer 1 may be formed through coating, evaporation or lamination.

When the area light source does not include the reflection layer, it is able for the area light source to emit light in a double-sided manner. At this time, two liquid crystal display panels may be arranged at two sides of the area light source respectively, so as to achieve a double-sided display function.

The first conductive structure 2 and the second conductive structure 5 may each be an entire conductive layer or include a plurality of conductive lines.

In some embodiments of the present disclosure, at least one of the first conductive structure 2 and the second conductive structure 5 may include a plurality of conductive lines, and each conductive line may be connected to a corresponding electrode of at least one light-emitting chip 4. Through each conductive line, it is able to control a powered-on state of the light-emitting chip 4 connected to the conductive line, thereby to control the light-emitting chips 4 at different regions to emit light or emit light at different brightness values. As a result, it is able for the area light source to adjust the brightness values at different regions, thereby to achieve a high dynamic rendering effect.

Figure 3:
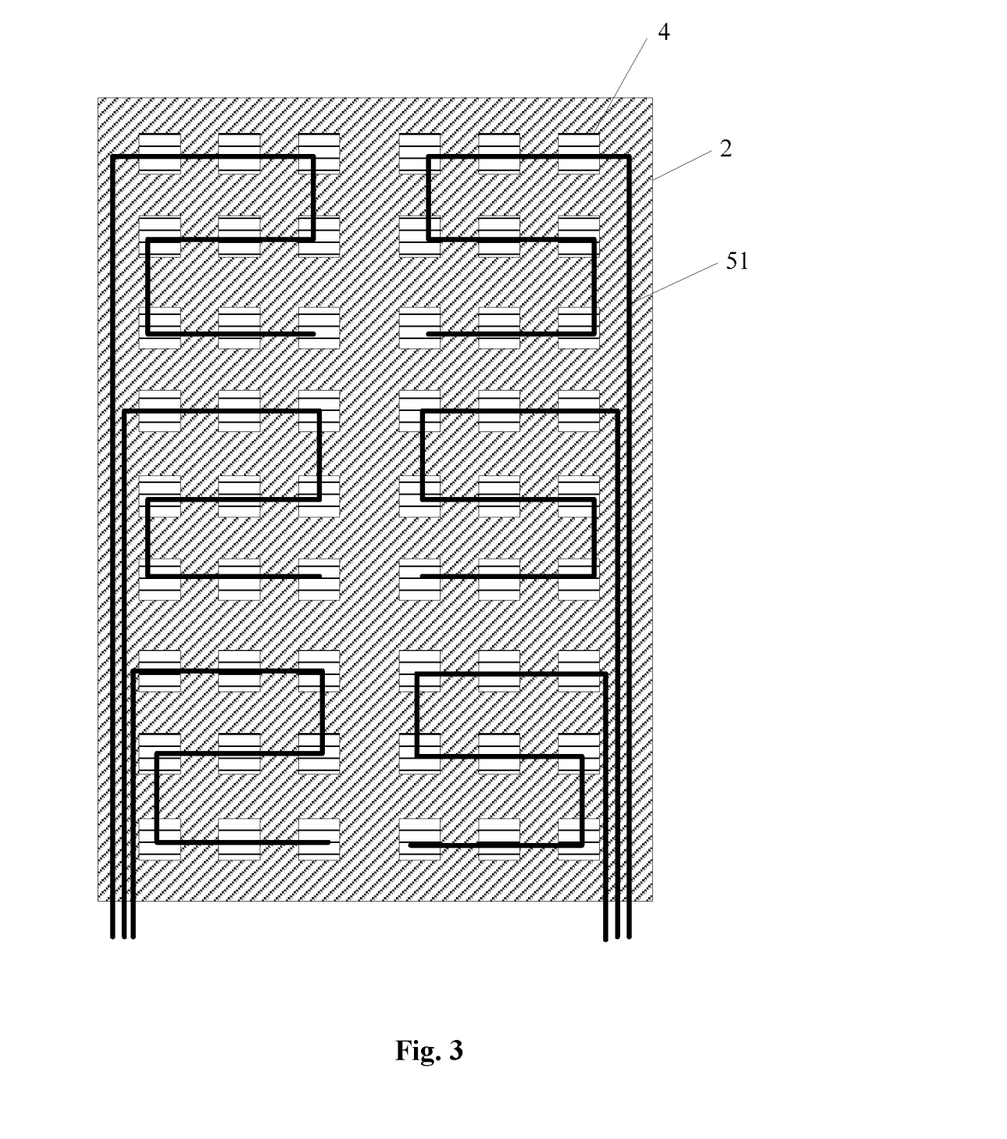
FIGS. 3-4 are planar views of the area light source according to one embodiment of the present disclosure.
Figure 4:
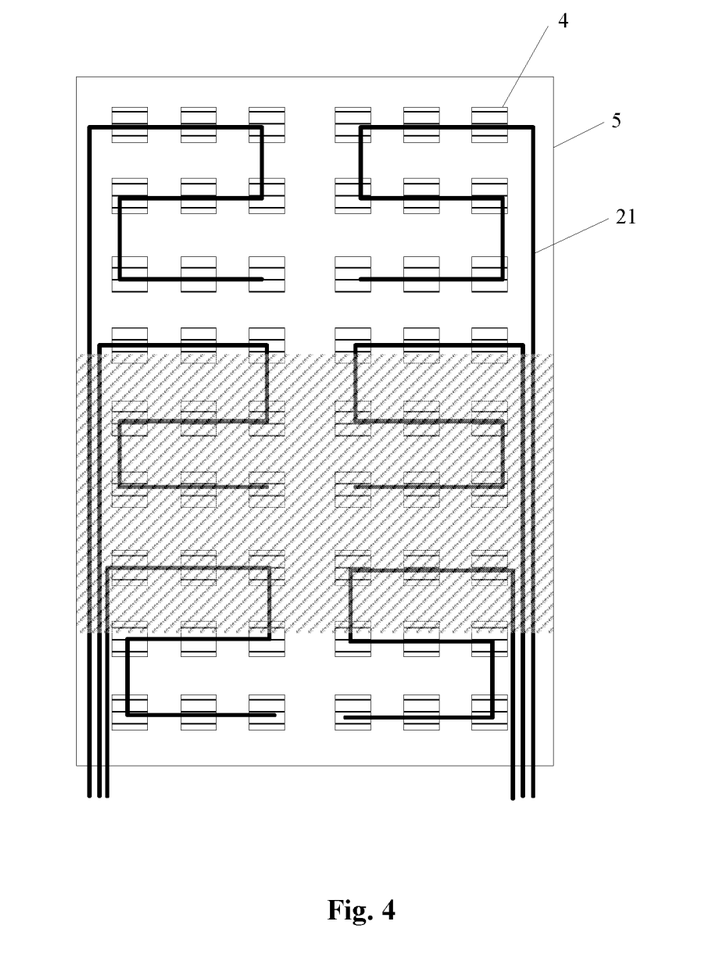

To be specific, as shown in FIG. 3, the first conductive structure 2 may be of a surface-like shape. At this time, it is unnecessary to pattern the first conductive structure 2, thereby to reduce the quantity of patterning processes. The second conductive structure 5 may include a plurality of conductive lines 51. Each conductive line 51 may be adopted to control at least one light-emitting chip 4, and different light-emitting chips 4 may be controlled by different conductive lines 51, so as to control the brightness values at different regions. In addition, as shown in FIG. 4, the second conductive structure 5 may be of a surface-like shape. At this time, it is unnecessary to pattern the second conductive structure 5, thereby to reduce the quantity of patterning processes. The first conductive structure 2 may include a plurality of conductive lines 21. Each conductive line 21 may be adopted to control at least one light-emitting chip 4, and different light-emitting chips 4 may be controlled by different conductive lines 21, so as to control the brightness values at different regions. It is able for the area light source to adjust the brightness values at different regions as long as one of the first conductive structure 2 and the second conductive structure 5 consists of the plurality of conductive lines. When the conductive structure is of a surface-like shape, it may be formed through a copper pouring or film coating process. When the conductive structure consists of the conductive lines, it may be formed through patterning after a copper pouring or film coating process.

The light-emitting chips 4 may be arranged regularly or irregularly. When the light-emitting chips 4 are arranged in an array form, uniform light may be generated, so as to be adapted to a situation where uniform backlight is required.

In some embodiments of the present disclosure, the first electrode 41 of each light-emitting chip 4 may be connected to the first conductive structure 2 via an anisotropic conductive adhesive, or through welding or lamination.

The second electrode 42 of each light-emitting chip 4 may be connected to the second conductive structure 5 via an anisotropic conductive adhesive, or through welding or lamination.

The present disclosure further provides in some embodiments a display device including the above-mentioned area light source as a backlight source of the display device. The display device may be any product or member having a display function, e.g., liquid crystal television, liquid crystal display, digital photo frame, mobile phone or flat-panel computer. The display device may further include a flexible circuit board, a printed circuit board and a back plate.

According to the embodiments of the present disclosure, the backlight source with a lamination structure may include the first conductive structure and the second conductive structure arranged opposite to each other, and the light-emitting layer 3 arranged between the first conductive structure and the second conductive structure and including the light-emitting chip 4. The light-emitting chip 4 may be powered on through the first conductive structure and the second conductive structure, so as to emit light. In the embodiments of the present disclosure, the backlight source of a surface-like shape may be provided when the light-emitting chip is encapsulated, so it is able to reduce the difficulty in converting the point light source to the line light source and then to the area light source, remarkably increase the light utilization and reduce the power consumption. In addition, it is unnecessary to provide any other element, so it is able to provide an ultra-thin product and reduce the manufacture cost. Furthermore, when each light-emitting chip is capable of emitting a monochromatic light beam, e.g., a red light beam, a green light beam or a blue light beam, the light-emitting chips emitting a red light beam, a green light beam and a blue light beam may be arranged periodically, so as to enable a liquid crystal display panel with the area light source to achieve a color display function.

The present disclosure further provides in some embodiments a method for manufacturing the area light source, including: forming the first conductive structure 2; forming the plurality of light-emitting chips 4 spaced apart from each other and arranged on the first conductive structure 2, the light-emitting chips 4 being insulated from each other, each light-emitting chip 4 including the first electrode 41 electrically connected to the first conductive structure 2 and the second electrode 42; and forming the second conductive structure 5 connected to the second electrode 42 of each light-emitting chip 4.

According to the embodiments of the present disclosure, the area light source with a lamination structure may include the first conductive structure 2 and the second conductive structure 5 arranged opposite to each other, and the light-emitting layer 3 arranged between the first conductive structure 2 and the second conductive structure 5 and including the light-emitting chip 4. The light-emitting chip 4 may be powered on through the first conductive structure 2 and the second conductive structure 5, so as to emit light. In the embodiments of the present disclosure, the area light source may be provided when the light-emitting chip 4 is encapsulated, so it is able to reduce the difficulty in converting the point light source to the line light source and then to the area light source, remarkably increase the light utilization and reduce the power consumption. In addition, it is unnecessary to provide any other element, so it is able to provide an ultra-thin product and reduce the manufacture cost.

In some embodiments of the present disclosure, the method may further include forming the insulation material 31 arranged between adjacent light-emitting chips 4. The insulation material 31 may be filled between the adjacent light-emitting chips 4, so as to enable the light-emitting chips 4 to be insulated from each other. The insulation material 31 may be an organic resin material or an inorganic insulation material, e.g., silicon oxide or silicon nitride.

In some embodiments of the present disclosure, the insulation material 31 is capable of emitting light under the excitation of a light beam from each light-emitting chip 4. In this regard, during the operation of the area light source, both the light-emitting chip 4 and the insulation material 31 may emit light, so as to increase the brightness of the area light source.

During the implementation, each light-emitting chip 4 may emit a blue light beam, and the insulation material 31 may be a quantum-dot material or a fluorescent adhesive capable of emitting light under the excitation of the blue light beam from the light-emitting chip 4. Through the combination of the light-emitting chip 4 and the insulation material 31, it is able to emit a white light beam. Of course, a component of the insulation material 31 and a color of the light beam from each light-emitting chip 4 may be adjusted so as to enable the light-emitting layer 3 to generate the light beam in any other color. In addition, the light-emitting chips 4 capable of emitting the light beams in different colors and different insulation materials 31 may be combined so as to generate the light beams in different colors, thereby to provide a colorful light source.

In some embodiments of the present disclosure, the method may further include forming the first protection structure 1, and forming the second protection structure 6 covering the second conductive structure 5. The forming the first conductive structure 2 may include forming the first conductive structure 2 on the first protection structure 1.

The first protection structure 1 and the second protection structure 6 may each be a rigid substrate, a circuit board, or a flexible substrate, e.g., a substrate made of PET or PI. The first protection structure 1 and the second protection structure 6 may be adopted to protect the area light source, so as to prevent oxygen and moisture from entering the area light source and prevent the area light source from being scratched. When the first protection structure 1 and the second protection structure 6 are each a flexible substrate, the area light source may also be applied to a flexible display device.

It should be appreciated that, the protection structure at a light-exiting side needs to be made of a transparent material, e.g., a thin transparent PET layer, so as to allow the light to pass therethrough, prevent oxygen and moisture from entering the area light source, and prevent the area light source from being scratched.

In some embodiments of the present disclosure, prior to forming the first conductive structure 2 on the first protection structure 1, the method may further include forming the reflection layer 7 on the first protection structure 1.

The reflection layer 7 may be arranged at a surface of the first protection structure 1 facing the first conductive structure 2, or at a surface of the first protection structure 1 away from the first conductive structure 2. Due to the protection function of the first protection structure 1, it is preferred that the reflection layer 7 may be arranged between the first protection structure 1 and the first conductive structure 2. In this regard, the first protection structure 1 may also protect the reflection layer 7. The reflection layer 7 and the first protection layer 1 may be formed through coating, evaporation or lamination.

In some embodiments of the present disclosure, the forming the first conductive structure 2 may include: forming an entire surface of conductive material as the first conductive structure 2; or forming a conductive material layer and patterning the conductive material layer to form a plurality of first conductive lines each connected to the first electrode 41 of at least one light-emitting chip 4. The forming the second conductive structure 5 may include: forming an entire surface of conductive material as the second conductive structure 5; or forming a conductive material layer and patterning the conductive material layer to form a plurality of second conductive lines each connected to the second electrode 42 of at least one light-emitting chip 4.

At least one of the first conductive structure 2 and the second conductive structure 5 may include a plurality of conductive lines, and each conductive line may be connected to a corresponding electrode of at least one light-emitting chip 4. Through each conductive line, it is able to control a powered-on state of the light-emitting chip 4 connected to the conductive line, thereby to control the light-emitting chips 4 at different regions to emit light or emit light at different brightness values. As a result, it is able for the area light source to adjust the brightness values at different regions, thereby to achieve a high dynamic rendering effect.

To be specific, as shown in FIG. 3, the first conductive structure 2 may be of a surface-like shape. At this time, it is unnecessary to pattern the first conductive structure 2, thereby to reduce the quantity of patterning processes. The second conductive structure 5 may include a plurality of conductive lines 51. Each conductive line 51 may be adopted to control at least one light-emitting chip 4, and different light-emitting chips 4 may be controlled by different conductive lines 51, so as to control the brightness values at different regions. In addition, as shown in FIG. 4, the second conductive structure 5 may be of a surface-like shape. At this time, it is unnecessary to pattern the second conductive structure 5, thereby to reduce the quantity of patterning processes. The first conductive structure 2 may include a plurality of conductive lines 21. Each conductive line 21 may be adopted to control at least one light-emitting chip 4, and different light-emitting chips 4 may be controlled by different conductive lines 21, so as to control the brightness values at different regions.

The method for manufacturing the area light source will be described hereinafter in conjunction with the drawings and embodiments. The method may include the following steps.

Figure 5:
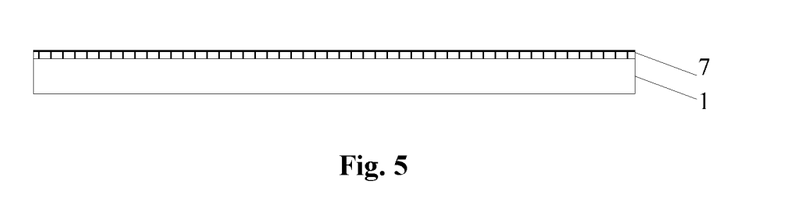
FIGS. 5-10 are schematic views showing the manufacture of the area light source according to one embodiment of the present disclosure.

Step 1: as shown in FIG. 5, providing the first protection structure 1 and forming the reflection layer 7 on the first protection structure 1.

The first protection structure 1 may be a rigid substrate, a circuit board, or a flexible substrate, e.g., a substrate made of PET or PI. The reflection layer 7 may be made of metal, and it may be formed on the first protection structure 1 through evaporation or sputtering.

Figure 6:
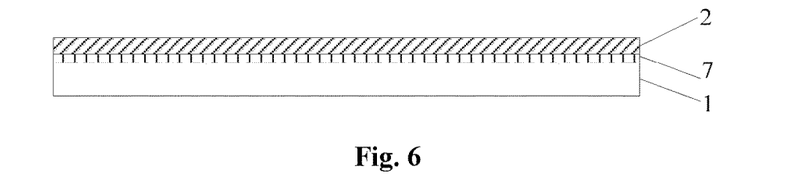

Step 2: as shown in FIG. 6, forming the first conductive layer 2 on the reflection layer 7.

The first conductive structure 2 may be deposited through magnetron-sputtering, thermal evaporation or any other film-forming process, and it may made of copper (Cu), aluminium (Al), argentum (Ag), molybdenum (Mo), chromium (Cr), neodymium (Nd), nickel (Ni), manganese (Mn), titanium (Ti), tantalum (Ta) or tungsten (W), or an alloy thereof. The first conductive structure 2 may be of a single-layered structure, or a multi-layered structure e.g., Cu/Mo, Ti/Cu/Ti or Mo/Al/Mo. Next, a photoresist may be applied onto the first conductive structure 2, and exposed through a mask plate, so as to form a photoresist unreserved region and a photoresist reserved region. Next, the photoresist may be developed, so as to fully remove the photoresist at the photoresist unreserved region, and maintain a thickness of the photoresist at the photoresist reserved region. Then, the first conductive structure 2 at the photoresist unreserved region may be fully etched off through an etching process, and the remaining photoresist may be removed, so as to acquire a pattern of the first conductive pattern 2 including a plurality of conductive lines.

Figure 7:
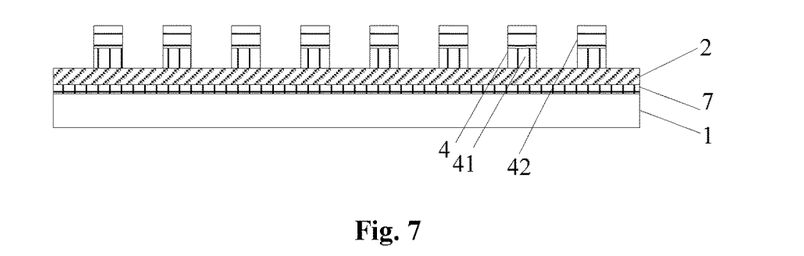

Step 3: as shown in FIG. 7, forming the light-emitting chips 4 on the first conductive structure 2, with the negative electrode 4 of each light-emitting chip 4 being connected to the first conductive structure 2.

Each conductive line of the first conductive structure 2 may be connected to the negative electrode 41 of at least one light-emitting chip 4.

Figure 8:
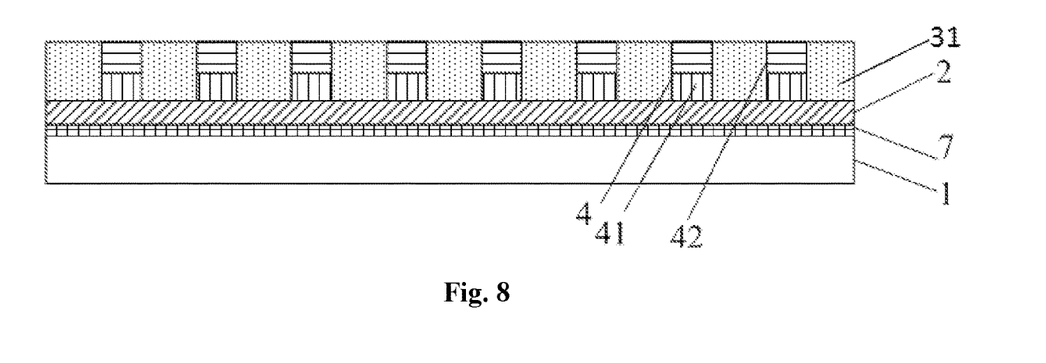

Step 4: as shown in FIG. 8, applying the insulation material 41 between the adjacent light-emitting chips 4.

The insulation material 31 may be an insulative fluorescent adhesive capable of emitting a white light beam under the excitation of a blue light beam.

Figure 9:
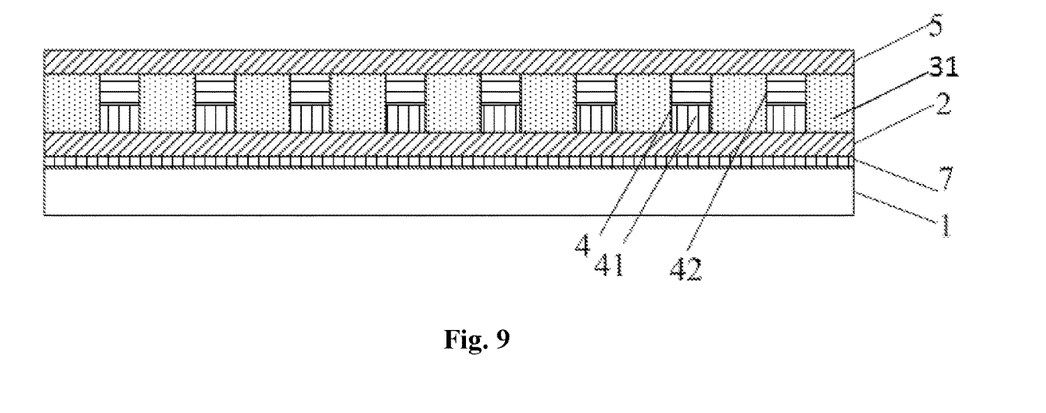

Step 5: as shown in FIG. 9, forming the second conductive structure 5, with the positive electrode 42 of each light-emitting chip 4 being connected to the second conductive structure 5.

The second conductive structure 5 may be deposited through magnetron sputtering, thermal evaporation or any other film-forming process, and it may be made of Cu, Al, Ag, Mo, Cr, Nd, Ni, Mn, Ti, Ta or W, or an alloy thereof. The second conductive structure 5 may be of a single-layered structure, or a multi-layered structure such as Cu/Mo, Ti/Cu/Ti or Mo/Al/Mo. The second conductive structure 5 may be of a surface-like shape, and connected to the positive electrode 42 of each light-emitting chip 4.

Figure 10:
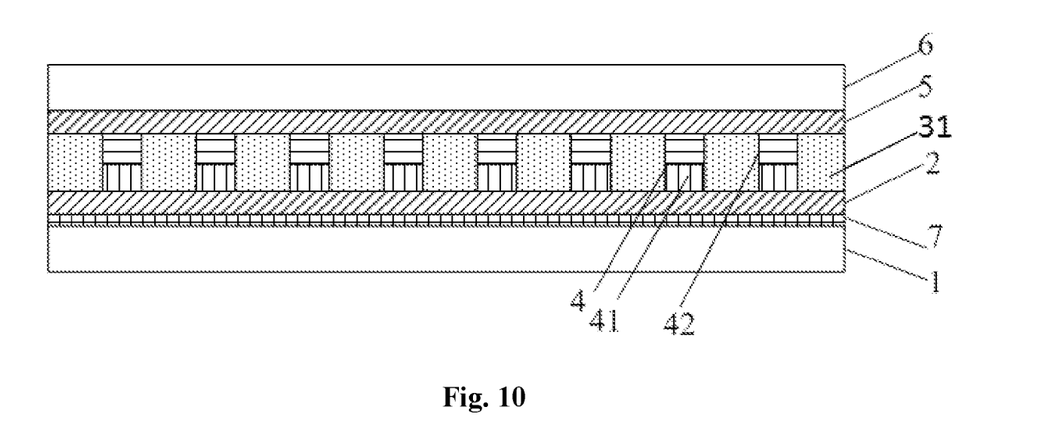

Step 6: as shown in FIG. 10, forming the second protection structure 6.

The second protection structure 6 may be arranged at a light-exiting side, and made of a transparent material, e.g., a thin transparent PET layer, so as to allow the light to pass therethrough, prevent oxygen and moisture from entering the area light source, and prevent the area light source from being scratched.

According to the embodiments of the present disclosure, the area light source with a lamination structure may include the first conductive structure 2 and the second conductive structure 5 arranged opposite to each other, and the light-emitting layer 3 arranged between the first conductive structure 2 and the second conductive structure 5 and including the light-emitting chip 4. The light-emitting chip 4 may be powered on through the first conductive structure 2 and the second conductive structure 5, so as to emit light. In the embodiments of the present disclosure, the area light source may be provided when the light-emitting chip 4 is encapsulated, so it is able to reduce the difficulty in converting the point light source to the line light source and then to the area light source, remarkably increase the light utilization and reduce the power consumption. In addition, it is unnecessary to provide any other element, so it is able to provide an ultra-thin product and reduce the manufacture cost. Furthermore, each conductive line of the first conductive structure may be adopted to control at least one light-emitting chip 4, and different light-emitting chips 4 may be controlled by different conductive lines, so as to control the brightness values at different regions.

In the embodiments of the present disclosure, the order of the steps is not limited to the serial numbers thereof. For a person skilled in the art, any change in the order of the steps shall also fall within the scope of the present disclosure if without any creative effort.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An area light source, comprising:
   a first conductive structure and a second conductive structure arranged opposite to each other;
   a light-emitting layer arranged between the first conductive structure and the second conductive structure and comprising a plurality of light-emitting chips insulated from each other,
   wherein a first electrode of each light-emitting chip is electrically connected to the first conductive structure, and a second electrode of each light-emitting chip is electrically connected to the second conductive structure,
   wherein at least one of the first conductive structure and the second conductive structure comprises a plurality of conductive lines, and each conductive line is connected to a corresponding electrode of at least one light-emitting chip, wherein the light-emitting chips are arranged in an array form, the first conductive structure is of a surface-like shape, and the second conductive structure comprises a plurality of conductive lines and is configured to control the light-emitting chips at different regions; or the light-emitting chips are arranged in an array form, the second conductive structure is of a surface-like shape, and the first conductive structure comprises a plurality of conductive lines and is configured to control the light-emitting chips at different regions, different light-emitting chips are controlled by different conductive lines.

2. The area light source according to claim 1, wherein the first electrode of each light-emitting chip is connected to the first conductive structure via an anisotropic conductive adhesive, and the second electrode of each light-emitting chip is connected to the second conductive structure via an anisotropic conductive adhesive.

3. A display device, comprising the area light source according to claim 1 as a backlight source.

4. The area light source according to claim 1, further comprising a first protection structure and a second protection structure arranged opposite to each other, wherein the first conductive structure is arranged at a side surface of the first protection structure facing the second protection structure, and the second conductive structure is arranged at a side surface of the second protection structure facing the first protection structure.

5. The area light source according to claim 4, wherein the first protection structure and the second protection structure are each a rigid substrate, a circuit board or a flexible substrate.

6. The area light source according to claim 1, further comprising a reflection layer arranged at a side of the light-emitting layer away from the second conductive structure.

7. The area light source according to claim 6, wherein the reflection layer is arranged between the first protection structure and the first conductive structure.

8. The area light source according to claim 1, wherein the light-emitting chips are separated from each other in a direction parallel to the first conductive structure and the second conductive structure, and the light-emitting layer further comprises an insulation material arranged between adjacent light-emitting chips.

9. The area light source according to claim 8, wherein the insulation material is configured to emit light under the excitation of a light beam from each light-emitting chip.

10. The area light source according to claim 9, wherein each light-emitting chip is configured to emit a blue light beam, and the insulation material comprises a quantum-dot material or a fluorescent adhesive.

11. A method for manufacturing an area light source, comprising:
forming a first conductive structure;
forming a plurality of light-emitting chips spaced apart from each other and arranged on the first conductive structure, adjacent light-emitting chips of the plurality of light-emitting chips being insulated from each other, each light-emitting chip comprising a first electrode and a second electrode, the first electrode being electrically connected to the first conductive structure; and
forming a second conductive structure connected to the second electrode of each light-emitting chip,
wherein at least one of the first conductive structure and the second conductive structure comprises a plurality of conductive lines, and each conductive line is connected to a corresponding electrode of at least one light-emitting chip,
wherein the light-emitting chips are arranged in an array form, the first conductive structure is of a surface-like shape, and the second conductive structure comprises the plurality of conductive lines and is configured to control the light-emitting chips at different regions; or the second conductive structure is of a surface-like shape, and the first conductive structure comprises the plurality of conductive lines and is configured to control the light-emitting chips at different regions,
different light-emitting chips are controlled by different conductive lines.

12. The method according to claim 11, wherein the forming the first conductive structure comprises forming the first conductive structure of a surface-like shape, and the forming the second conductive structure comprises forming a conductive material layer and patterning the conductive material layer to form a plurality of second conductive lines each connected to the second electrode of at least one light-emitting chip.

13. The method according to claim 11, wherein the forming the second conductive structure comprises forming the second conductive structure of a surface-like shape, and the forming the first conductive structure comprises forming a conductive material layer and patterning the conductive material layer to form a plurality of first conductive lines each connected to the first electrode of at least one light-emitting chip.

14. The method according to claim 11, wherein subsequent to forming the plurality of light-emitting chips spaced apart from each other and arranged on the first conductive structure, the method further comprises forming an insulation material filled between adjacent light-emitting chips.

15. The method according to claim 11, further comprising:
forming a first protection structure; and
forming a second protection structure covering the second conductive structure;
wherein the forming the first conductive structure comprises forming the first conductive structure on the first protection structure.

16. The method according to claim 15, wherein prior to forming the first conductive structure on the first protection structure, the method further comprises forming a reflection layer on the first protection structure.

* * * * *

UNITED STATES PATENT AND TRADEMARK OFFICE
CERTIFICATE OF CORRECTION

PATENT NO. : 11,562,988 B2
APPLICATION NO. : 16/478340
DATED : January 24, 2023
INVENTOR(S) : Jian Sang, Haiwei Sun and Junjie Ma It is certified that error appears in the above-identified patent and that said Letters Patent is hereby corrected as shown below:

On the Title Page

Item (73) Delete:
"(73) Assignee: BEIJING BOE OPTOELECTRONICS TECHNOLOGY GROUP CO. LTD., Beijing (CN); BOE TECHNOLOGY GROUP CO., LTD., Beijing (CN)"

And Insert:
--(73) Assignee: BEIJING BOE OPTOELECTRONICS TECHNOLOGY CO., LTD., Beijing (CN); BOE TECHNOLOGY GROUP CO., LTD., Beijing (CN)--.

Signed and Sealed this
Ninth Day of May, 2023

Katherine Kelly Vidal
*Director of the United States Patent and Trademark Office*